US006275023B1

United States Patent
Oosaki et al.

(10) Patent No.: US 6,275,023 B1
(45) Date of Patent: Aug. 14, 2001

(54) SEMICONDUCTOR DEVICE TESTER AND METHOD FOR TESTING SEMICONDUCTOR DEVICE

(75) Inventors: Akio Oosaki, Kanagawa; Yoshihiko Hayashi, Tokyo, both of (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/495,956

(22) Filed: Feb. 2, 2000

(30) Foreign Application Priority Data

Feb. 3, 1999 (JP) ................................................. 11-026354

(51) Int. Cl.[7] ................................................. G01R 31/28
(52) U.S. Cl. ........................................ 324/158.1; 324/765
(58) Field of Search ................................... 324/126, 128, 324/158.1, 765; 327/170, 551; 326/62; 714/699

(56) References Cited

U.S. PATENT DOCUMENTS

| | | | |
|---|---|---|---|
| 4,947,113 | * | 8/1990 | Chism et al. ........................... 326/62 |
| 5,086,271 | * | 2/1992 | Haill et al. .......................... 324/158.1 |
| 5,266,894 | * | 11/1993 | Takagi et al. .......................... 324/765 |
| 5,736,851 | * | 4/1998 | Noda ................................... 324/158.1 |

OTHER PUBLICATIONS

C. Tsunetomo et al. "High Speed Testing Technique for CMOS LSI with High Impedance Transmission Lines", Technical Report of IEICE, ICD92–121, Dec. 1992, pp. 45–49.

* cited by examiner

Primary Examiner—Ernest Karlsen
(74) Attorney, Agent, or Firm—Mattingly, Stanger & Malur, P.C.

(57) ABSTRACT

A semiconductor device according to the present invention comprises a first switch circuit connected between a transmission line and an input terminal of a comparator and adapted to be turned ON according to a change of a response waveform from High level to Low level to connect an impedance substantially equal to a characteristic impedance of the transmission line to the transmission line, a second switch circuit connected between the transmission line and the input terminal of the comparator and adapted to be turned ON according to a change of the response waveform from Low level to High level to connect an impedance substantially equal to the characteristic impedance of the transmission line to the transmission line, a first voltage generator circuit connected to the first switch circuit for generating a voltage for clamping the level of the response waveform at a certain Low level and a second voltage generator circuit connected to the second switch circuit for generating a voltage for clamping the level of the response waveform at a certain High level.

16 Claims, 9 Drawing Sheets

(a) HIGH SIDE CLAMP SWITCH VOLTAGE (b) LOW SIDE CLAMP SWITCH VOLTAGE

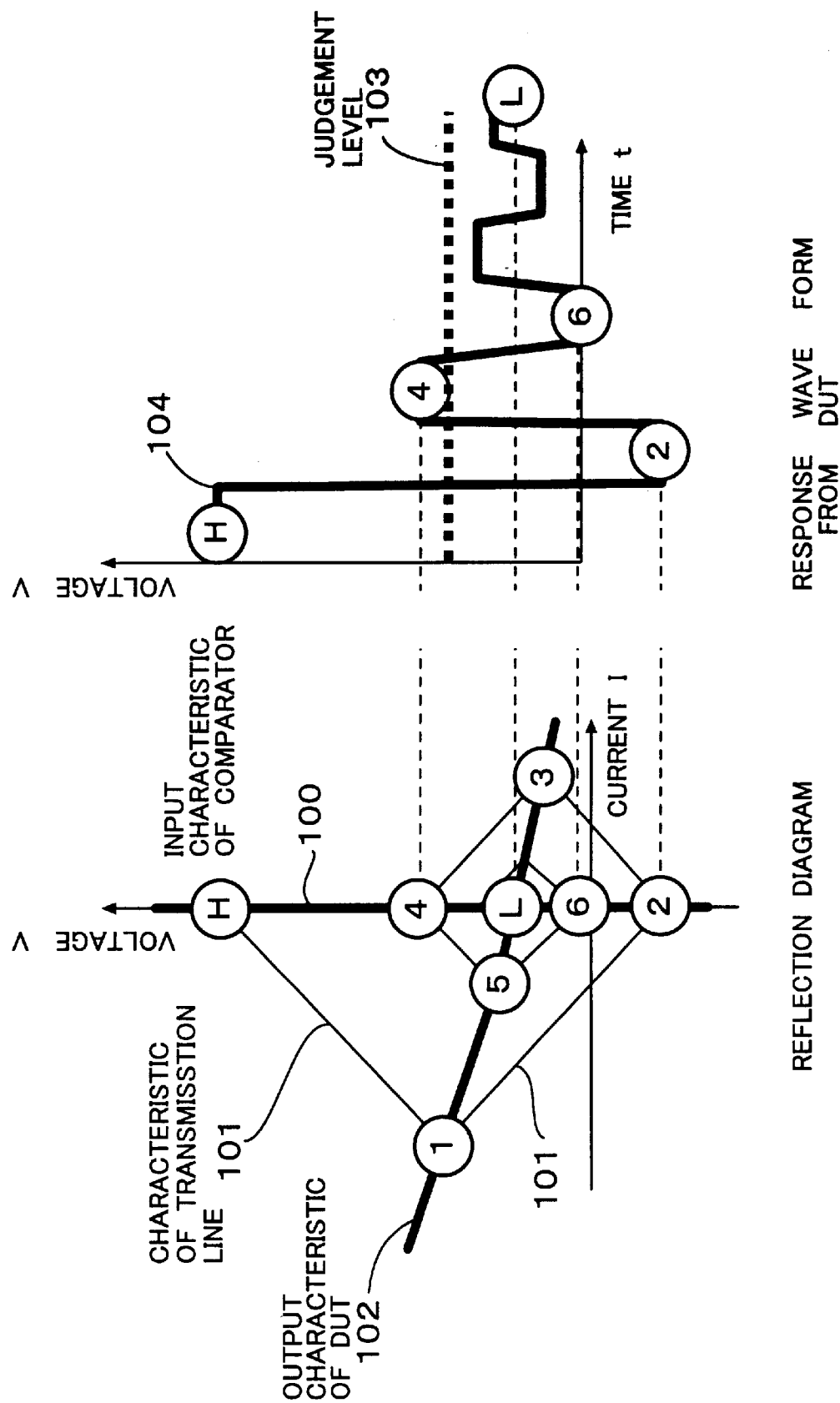

SEMICONDUCTOR DEVICE TESTER AND METHOD FOR TESTING SEMICONDUCTOR DEVICE

BACKGROUND OF THE INVENTION

1. Technical Field of the Invention

The present invention relates to a semiconductor device tester and a test method of a semiconductor device and, particularly, to an IC tester capable of obtaining a desired test signal waveform by restricting ringing thereof due to multiple reflection, which occurs between a pin electronics circuit of the tester and a semiconductor device under test (DUT), which is a semiconductor IC connected to the pin electronics circuit through a transmission line.

2. Description of the Related Art

In an IC tester, an operation test or performance test, etc., of a DUT by driving a predetermined terminal of the DUT by supplying a predetermined voltage signal thereto, determining a level of a response signal waveform output from an output terminal or an input/output terminal of the DUT, which is received by the tester after a predetermined time, by a judge circuit according to a strobe signal generated with a predetermined timing in a judge mode and comparing the level of the response signal waveform with an expected value.

An operating clock frequency of a recent DUT is in a high frequency range and an output waveform frequency thereof is also high. Therefore, an IC tester is connected through a transmission line for high frequency, such as coaxial cable, to respective terminals of the DUT. Consequently, waveform ringing occurs by multiple reflection between a feeding side and a receiving side of the transmission line, which is a problem of a high frequency circuit. This problem becomes severe in a case where an output waveform obtained at an output terminal of the DUT is judged on the IC tester side without terminating the transmission line, through which the output waveform is received, with a matching impedance, since, in such case, a waveform distortion occurs by reflection waves due to impedance mismatching between an output impedance of the DUT and an impedance of the transmission line.

In order to eliminate the effect of signal waveform ringing due to multiple reflection of a response waveform output from a DUT in a pin electronics circuit of a conventional IC tester designed on the basis of the assumption that a transmission line itself is not driven and merely connects an input/output (I/O) terminal of the DUT to a TTL or CMOS device, there is a technique proposed in the Association of Electronics, Information and Communications Engineers of Japan, Technical Report ICD92-121(1992), 45–50. According to the proposed technique, an erroneous judgement of signal level, due to ringing of a response waveform, in an analog comparator of a judge circuit of an IC tester for judging an output waveform level is prevented by removing the ringing by injecting current from a load current injection circuit (dynamic load), which is provided in the IC tester as a standard equipment, to the side of a load (DUT).

FIGS. 9(a) and 9(b) show a reflection diagram of the prior art IC tester and a response waveform from the DUT as the load, respectively, for explaining the multiple reflection and generation of ringing in such IC tester. In FIG. 9(a), abscissa indicates current I and ordinate indicates voltage V and, in FIG. 9(b), an input waveform (response waveform from the DUT) at an input terminal of the analog comparator for judging the level of the output waveform is shown.

In FIG. 9(a), since an input resistance of the analog comparator is very large as shown by a thick line 100 on the voltage axis and is usually in a range from several hundreds kΩ to several tens MΩ, its current/voltage characteristics can be considered as on the ordinate. On the other hand, since the characteristic impedance Zo of a transmission line such as coaxial cable is usually 50Ω, a current/voltage characteristics of the transmission line becomes as shown by a line 101. Further, since an output resistance of the DUT whose impedance is being reduced recently is in a range from several Ω to several tens Ω, current/voltage characteristics of the DUT when the output of the DUT is changed from H to L becomes as shown by a thick line 102.

The change of the output voltage of the DUT from H to L is realized through a plurality of points. That is, in response to a first reflection wave, a point H on the line 100 along the voltage line at the input terminal of the comparator is shifted to a cross point ① of the characteristic line 101, which is the characteristic impedance of the transmission line, and the output characteristic line 102 of the DUT and, then, shifted from the point ② to a cross point ② of the input characteristic line 100 of the analog comparator and the characteristic line 101 in response to a second reflection wave. Further, in response to a third reflection wave, it is shifted from the point ② to a cross point ③ of a line parallel to the characteristic impedance line 101 and the output characteristic line 102 of the DUT, and so on. As a result, the H level of the input terminal of the comparator reaches a L level through a route H -①-②-③-④-⑤- L. Representing this on a graph having abscissa as time and ordinate as voltage, the input waveform of the comparator becomes a ringing waveform as shown in FIG. 9(b).

It is assumed in the judge circuit of the IC tester, which receives such response waveform, that the analog comparator for judging a level of the output waveform has a Low level judge voltage 103 shown by a dotted line in FIG. 9(b). The judge voltage 103 is 0.4V in a case where the DUT is a memory such as DRAM and an output of the DUT such as logic, etc., is substantially 0V. Therefore, the response waveform 104 of the DUT at the input terminal of the analog comparator exceeds the Low level judge voltage 103 in the ④ state shown in FIG. 9(b). If the analog comparator performs the low level judgement with this timing, a result thereof becomes erroneous.

In order to avoid such situation, the judgement is performed in a judge mode set by supplying a load current in a range, for example, from ten and several mA to several tens mA, which is predetermined according to the H and L output waveforms, from a constant current source to specific output terminals as injection current from the dynamic load. However, the dynamic load is originally provided in the IC tester in order to supply a load current to the output terminal of the DUT to thereby reproduce a dummy load of the DUT when the DUT is under test. The load current is different from the current for preventing the ringing. Therefore, the dynamic load is used to either provide the dummy of the DUT or prevent the ringing. The load current supply circuit (dynamic load) is usually connected to an output of the driver on the transmission line side or to the input terminal of the comparator through a diode switch.

The diode switch is usually constructed with a diode bridge and controls the supply of the load current by ON-OFF controlling the diode bridge according to the H and L outputs at the output terminal. In this respect, the diode switch is kept in OFF state in other time than the judge mode.

In the pin electronics circuit of TTL or CMOS, which is based on non-termination scheme and performs the waveform judgement by receiving the response waveform from the DUT through the transmission line, multiple reflection occurs in receiving the response waveform at the analog comparator, which is the judge circuit. Therefore, the ringing due to the multiple reflection exceeds the comparison level of the analog comparator and causes the erroneous judgement unless the current for preventing the ringing is injected from the dynamic load with a good timing.

On the other hand, the conventional dynamic load is constructed with the diode bridge and the constant current source, as mentioned previously. Therefore, electric power is always consumed in the dynamic load in the judge mode even when current is not injected to the side of the DUT (load).

When such diode bridge is utilized, diodes whose leak current is small must be used in such diode bridge. Therefore, in the conventional IC tester, the diode switch portion of the dynamic load must be provided as a discrete circuit. Further, since a number of pin electronics circuits are used, the size of the IC tester becomes large due to the provision of such discrete circuit.

Further, since, when the diode switch portion is constructed with such discrete circuit, the length of the wiring between the diode switch (diode bridge) and the buffer circuit becomes large, a high speed response becomes impossible if the output signal frequency becomes high, causing a high precision measurement to become impossible.

Incidentally, the characteristic impedance of the transmission line in the standard IC tester is 50Ω, as mentioned previously. Assuming that the output amplitude of the DUT is 5V and its output impedance is 10Ω, an initial under-shoot of the ringing shown at the point ② in FIG. 9(b) becomes close to 4V. The value of the injection current from the dynamic load, which is required to cancel out such large under-shoot, becomes as large as 80 mA.

Therefore, power consumption of the whole IC tester utilizing the diode bridge and, hence, heat generation thereof becomes large. Consequently, the high precision test becomes difficult.

SUMMARY OF THE INVENTION

A first object of the present invention is to provide an IC tester capable of restricting ringing generated by multiple reflection of a response waveform from a DUT in a transmission line between the DUT and a pin electronics circuit.

A second object of the present invention is to provide an IC test method with which ringing generated by multiple reflection of a response waveform from a DUT in a transmission line between the DUT and a pin electronics circuit can be restricted.

In order to achieve the first object of the present invention, an IC tester according to the present invention is featured by comprising a first switch circuit connected between a transmission line and an input terminal of an analog comparator of the IC tester and adapted to be turned ON according to a change of a response waveform from High level to Low level to connect an impedance substantially equal to a characteristic impedance of the transmission line to the transmission line, a second switch circuit connected between the transmission line and the input terminal of the analog comparator of the IC tester and adapted to be turned ON according to a change of the response waveform from Low level to High level to connect an impedance substantially equal to the characteristic impedance of the transmission line to the transmission line, a first voltage generator circuit connected to the first switch circuit for generating a voltage for clamping the response waveform at a certain Low level and a second voltage generator circuit connected to the second switch circuit for generating a voltage for clamping the response waveform at a certain High level.

Each of the first and second switch circuits has a transistor construction and is connected to the transmission line by turning the transistor construction ON. The impedance substantially equal to the characteristic impedance of the transmission line is an output side internal impedance of the transistor construction and functions to restrict multiple reflection of the response waveform.

Further, in order to achieve the second object of the present invention, an IC test method according to the present invention is featured by comprising the steps of turning a first switch circuit connected between a transmission line and an input terminal of an analog comparator ON according to a change of a response waveform from High level to Low level to connect an impedance substantially equal to a characteristic impedance of the transmission line to the transmission line, turning a second switch circuit connected between the transmission line and the input terminal of the analog comparator ON according to a change of the response waveform from Low level to High level to connect an impedance substantially equal to the characteristic impedance of the transmission line to the transmission line, clamping the response waveform at a certain Low level when the response waveform becomes the certain Low level or lower and clamping the response waveform at a certain High level when the response waveform becomes the certain High level or higher.

As mentioned, each of the first switch circuit, which is turned ON according to the change of the response waveform from High level to Low level, and the second switch circuit, which is turned ON according to the change of the response waveform from Low level to High level, may be a transistor circuit, which functions to provide a termination resistance by connecting an internal impedance of an output side of the transistor when turned ON, such as an impedance between a collector and an emitter thereof or an impedance, which is a sum of the internal impedance and a resistance value of a resistor connected in series with the internal impedance to the transmission line. With such construction, it is possible to restrict the multiple reflection of the response waveform.

Further, it is possible to absorb reflection wave to thereby restrict ringing, by clamping voltage of the transmission line at certain High level, which is generated by a voltage generator circuit, in the case where the transistor is turned ON in response to the response waveform in High level, when the transmission line voltage exceeds a certain High level, or clamping voltage of the transmission line at certain Low level, which is generated by the voltage generator circuit, in the case where the transistor is turned ON in response to the response waveform in Low level, when the transmission line voltage becomes lower than a certain Low level.

Since, therefore, the level of the response waveform becomes fixed in either case, it is possible to prevent an erroneous judgement of the comparator for judging a level of the response waveform. Further, it becomes possible to measure an exact timing of the response waveform from the DUT.

Further, since any current does not flow except when reflection wave is absorbed, the consumption of power of the tester can be reduced.

Therefore, highly precise waveform judgement becomes possible. Since, in this case, it is not necessary to use a high speed diode bridge, the leak current becomes small. Further, the switching control is not required, so that the circuit construction can be simplified and the control operation becomes simple. Moreover, the circuit can be easily integrated.

Particularly, the first and second voltage generator circuits each composed of a resistor, a transistor and a variable voltage source are provided as a multiple reflection restricting circuit provided in the vicinity of the input terminal of the analog comparator in the pin electronics circuit. It is preferable that a composite resistance value of the resistor and the ON resistance of the transistor of each voltage generator circuit is made substantially equal to the characteristic impedance of the transmission line, which connects the pin electronics circuit and the DUT mutually. By setting the voltage levels of the first and second variable voltage generators of the multiple reflection restricting circuit to levels with which the voltage levels of the transmission line on the side of the comparator become substantially equal to the L and H output levels of the DUT, respectively, it becomes possible to match only the reflected voltage component to thereby prevent multiple reflection from occurring.

BRIEF DESCRIPTION OF THE DRAWINGS

The above mentioned and other objects, features and advantages of the present invention will become more apparent by reference to the following detailed description of the invention taken in conjunction with the accompany drawings, in which:

FIGS. 2(A) and 2(B) illustrate an operation of the multiple reflection restricting circuit shown in FIG. 1, in which FIG. 2(A) is a reflection diagram and FIG. 2(B) shows a response waveform;

FIGS. 5(A) and 5(B) illustrate a switching operation of a clamp voltage of a response waveform from a DUT, in which FIG. 5(A) illustrates a switching operation of a High side clamp voltage and FIG. 5(B) illustrates a switching operation of a Low side clamp voltage;

FIGS. 9(A) and 9(B) show a reflection diagram and a response waveform from a DUT, respectively, for explaining the multiple reflection and generation of ringing in such IC tester.

DETAILED DESCRIPTION OF THE PREFERRED EMBODIMENTS

Figure 3:
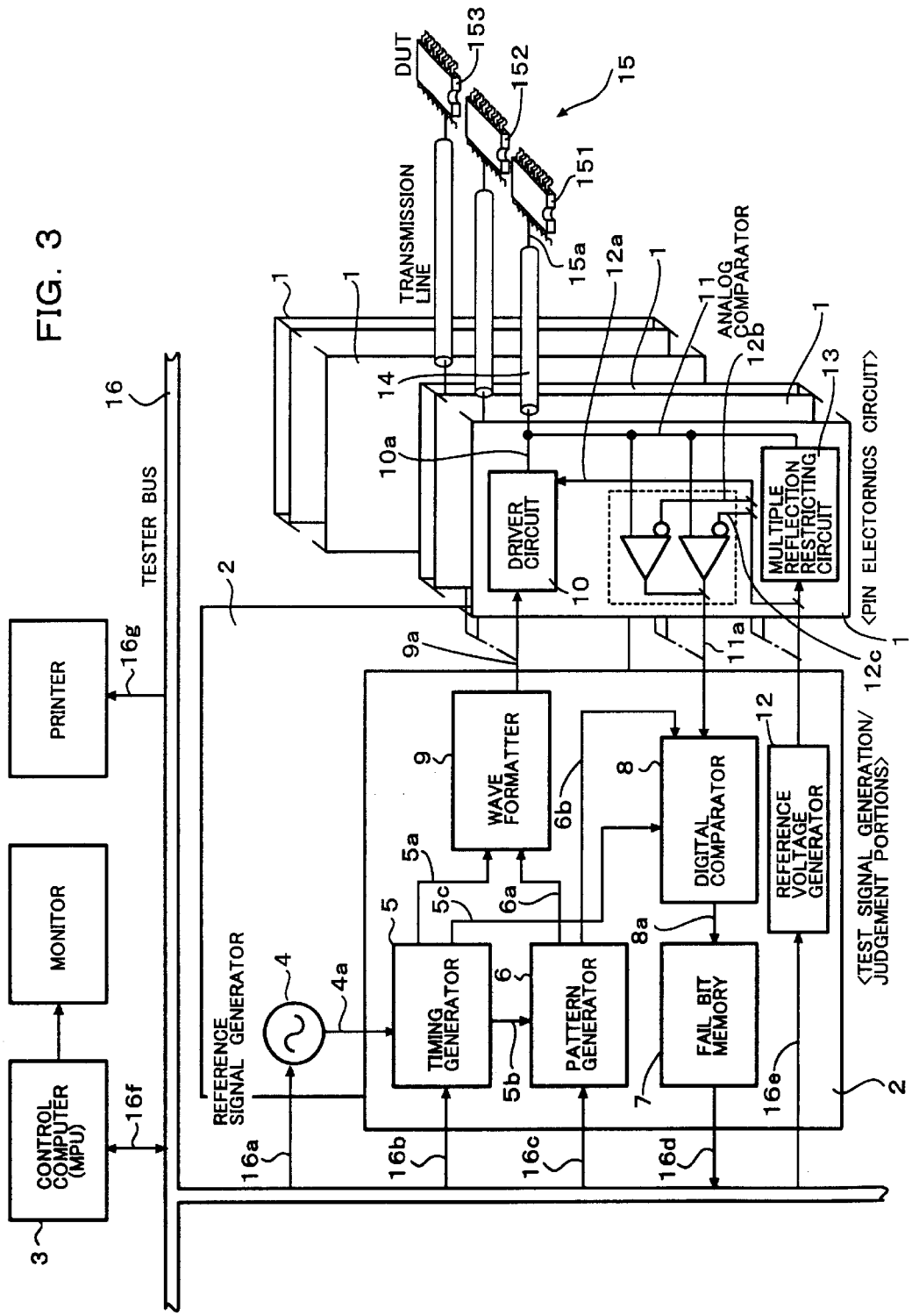
FIG. 3 is a circuit diagram of a whole IC tester equipped with the multiple reflection restricting circuit according to the present invention.

FIG. 3 is a circuit diagram of a whole IC tester equipped with the multiple reflection restricting circuit according to the present invention.

In FIG. 3, the IC tester comprises a plurality of identical pin electronics circuits 1, a plurality of identical test signal generation/judgement portions 2, a control computer (or MPU) 3, a reference signal generator 4, a monitor, a printer and a tester bus 16 for connecting between the control computer 3, the printer and the test signal generation/judgement portions 2, etc.

Each pin electronics circuit 1 includes a driver circuit 10, an analog comparator 11 and a multiple reflection restricting circuit 13.

Each test signal generation/judgement portion 2 comprises a timing generator 5, a pattern generator 6, a fail bit memory 7, a digital comparator 8, a waveform formatter 9 and a reference voltage generator 12.

The driver circuit 10 of each pin electronics circuit 1 receives a test waveform signal 9a from the waveform formatter 9 of the test signal generation/judgement portion 2 and an output of the driver circuit 10 is supplied to one of DUT's 15 including DUT's 151, 152 and 153, etc., for example, the DUT 151 through one of transmission lines 14, which are coaxial cables. The driver circuit 10 receives a response waveform 15a from the DUT 151 as an output waveform of the DUT 151 through the transmission line 14 after a predetermined time and supplies it to the analog comparator 11 for performing a waveform level judgement. The multiple reflection restricting circuit 13 has an output connected to a junction between the driver circuit 10 and the transmission line 14.

The reference signal generator 4 receives a signal 16a from the tester bus 16 and generates a reference clock 4a, which becomes a time reference of a test waveform, on the basis of the signal 16a. The timing generator 5 receives the reference clock 4a and a timing setting signal 16b from the tester bus 16 and counts the reference clock 4a according to the timing setting signal 16b to generate phase clock signals 5a, 5b and 5c, which have desired periods and time delays, respectively. The pattern generator 6 receives a signal 16c from the tester bus 16 and generates a pattern data signal 6a with the timing of the phase signal 5b from the timing generator 5.

The waveform formatter 9 generates a test waveform signal 9a for testing the DUT 151 by logically combining the pattern data signal 6a with the timing signal 5a. The driver circuit 10 wave-shapes the test waveform signal 9a to a test waveform 10a having a level, H or L, determined by a waveform setting level signal 12a from the reference voltage generator 12 and supplies the test waveform 10a to the DUT 151 through the transmission line 14.

The analog comparator 11 compares the response waveform 15a from the DUT 151 with respective reference voltage waveforms 12b and 12c generated by the reference voltage generator 12, and supplies a result 11a of the comparison to the digital comparator 8 of the test signal generation/judgement portion 2. In this case, the multiple reflection restricting circuit 13 of the pin electronics circuit 1 restricts a multiple reflection voltage generated due to a difference between a characteristic impedance of the transmission line 14 and an input impedance of the analog comparator 11, by performing an impedance matching.

The digital comparator 8 compares the comparison result 11a of the response waveform of the DUT 151, which results from the comparison performed by the analog comparator 11, with the pattern data signal 6b having the expected value corresponding to a favorable response, according to the timing of the phase signal 5c, and supplies a judgement signal 8a indicating that the DUT 151 has no problem to the fail bit memory 7.

The fail bit memory 7 stores the judgement signal 8a and outputs the latter to the control computer 2 through the tester bus 16 as a judge result 16d after the test is ended. The above mentioned operation is performed for respective pins of the respective DUT's 15 simultaneously to complete the judgement of the DUT's 15.

A relation between an operation of the pin electronics circuit 1 and the reflection restricting operation of the IC tester will be described with reference to FIG. 1, which shows a detailed circuit diagram of the pin electronics circuit 1. The driver circuit 10 receives the test waveform 9a from the waveform formatter 9 and sends the output waveform to the coaxial cable 14 through a resistor 10b for regulating the output level of the driver circuit 10. The output waveform is supplied as the test waveform to the DUT 151 through the transmission line 14. After a predetermined time therefrom, a response waveform 15a (output waveform) is supplied from the DUT 151 to the analog comparator 11 through the transmission line 14. In this circuit, the multiple reflection restricting circuit 13 is connected to a junction point N of a terminal of the resistor 10b on the side of the transmission line 14.

The driver circuit 10 receives a waveform voltage data 12a from the test signal generation/judgement portion 2 with the timing of the test waveform signal 9a and outputs the test waveform having a voltage level corresponding to the waveform voltage data 12a. The driver circuit 10 becomes in a high resistance mode with the timing of the test waveform signal 9a at a time when it receives the response waveform 15a from the DUT 151. In the high resistance mode, the output impedance of the driver circuit 10 becomes high and is given as a switching time shorter than a time period of a DUT output side (O side) of an I/O switching time of the DUT 151, the I/O switching time period or the I/O switching time period.

Incidentally, the regulating resistance 10b connected to the driver circuit 10 is matched by making the driver output resistance in applying the test waveform equal to the characteristic impedance of the transmission line 14.

On the other hand, the multiple reflection restricting circuit 13 restricts multiple reflection by performing an impedance matching between the ringing of the response voltage waveform due to multiple reflection, which is caused by the inconsistency of the output resistance of the DUT 151, the characteristic impedance of the transmission line 14 and the input impedance of the comparator 11, and the characteristic impedance of the transmission line 14. The comparator 11 receives the response waveform 15a from the DUT 151, whose reflection is restricted by the multiple reflection restricting circuit 13, through the transmission line 14, compares it with the comparison reference voltage levels 12b and 12c and outputs the comparison result signals 11a and 11b.

The multiple reflection restricting circuit 13 is constructed with a Low side clamp voltage switch circuit 130 having a variable voltage source 134 and a High side clamp voltage switch circuit 131 having a variable voltage source 137. Voltage levels of the variable voltage sources 134 and 137 are controlled by a clamp voltage control signal 13i from the test signal generation/judgement portion 2 correspondingly to the H and L output voltages from the DUT 151, respectively. The Low side clamp voltage switch circuit 130 is constructed with a NPN type bipolar transistor 132 having a base connected to the variable voltage source 134, a collector connected to a positive power source line Vcc and an emitter connected to the junction point N to the transmission line 14 through a resistor 133. The High side clamp voltage switch circuit 131 is constructed with a PNP type bipolar transistor 135 having a base connected to the variable voltage source 137, a collector connected to a negative power source line Vee and an emitter connected to the junction point N to the transmission line 14 through a resistor 136.

The voltages of the variable voltage sources 134 and 137 can be set to values in a certain positive voltage range including the ground potential and a certain negative voltage range including the ground potential, respectively.

When the level of the response waveform 15a of the DUT 151 is changed from H to L, the response waveform 15a at the input terminal of the comparator 11 connected to the junction point N becomes substantially lower than the L level due to the influence of reflected wave. At this time, the transistor 132 of the Low side clamp voltage switch circuit 130 is turned ON, so that a current flows from the power source line Vcc through the resistor 13, which is provided in order to make the ON resistance of the transistor 132 equal to the characteristic impedance Zo of the transmission line 14, to the junction point N and hence the transmission line 14. Therefore, a sum of the ON resistance of the transistor 132 and the resistance value of the resistor 133 is set substantially equal to the characteristic impedance Zo of the transmission line 14 and the voltage of the variable voltage source 134 of the Low side clamp voltage switch circuit 130 is set to the L value of the DUT 151. In this manner, the transistor 132 is turned ON when the level of the response waveform 15a becomes lower than the predetermined value.

As mentioned, the Low side clamp voltage switch circuit 130 operates only when the level of the response waveform 10a at the input terminal of the comparator 11 is lower than the level L of the DUT 151 by a predetermined value or more. Therefore, current is not always consumed, so that it becomes possible to reduce the power consumption. Further, since the impedance connected to the transmission line 14 when the transistor 132 is turned ON is set to a value substantially equal to the characteristic impedance Zo of the transmission line 14, ringing due to reflected wave is restricted.

Similarly, when the level of the response waveform 10a from the DUT 151 is changed from L to H, the High side clamp voltage switch circuit 131 operates when the voltage level of the response waveform 10a exceeds a level corresponding to the H level of the DUT 151. The High side clamp voltage switch circuit 131 on a pull side is complementarily arranged in potential to the Low side clamp voltage switch circuit 130 on a push side about the transmission line 14 as a reference. Since a sum of the ON resistance of the transistor 135 and the resistance value of the resistor 136 is set substantially equal to the characteristic impedance Zo of the transmission line 14 and the voltage of the variable voltage source 137 of the High side clamp voltage switch circuit 131 is set to the H level of the DUT 151, the transistor 137 is turned ON when the level of the response waveform 15a becomes higher than the level H of the DUT 151 by a predetermined value or more. Although the operation of the High side clamp voltage switch circuit 131 is similar to the Low side clamp voltage switch circuit 130, the High side clamp voltage switch circuit 131 does not inject current to but pull current from the transmission line 14.

With this High side clamp voltage switch circuit, it is also possible to reduce the power consumption and to restrict ringing due to reflected wave.

Figure 2B:
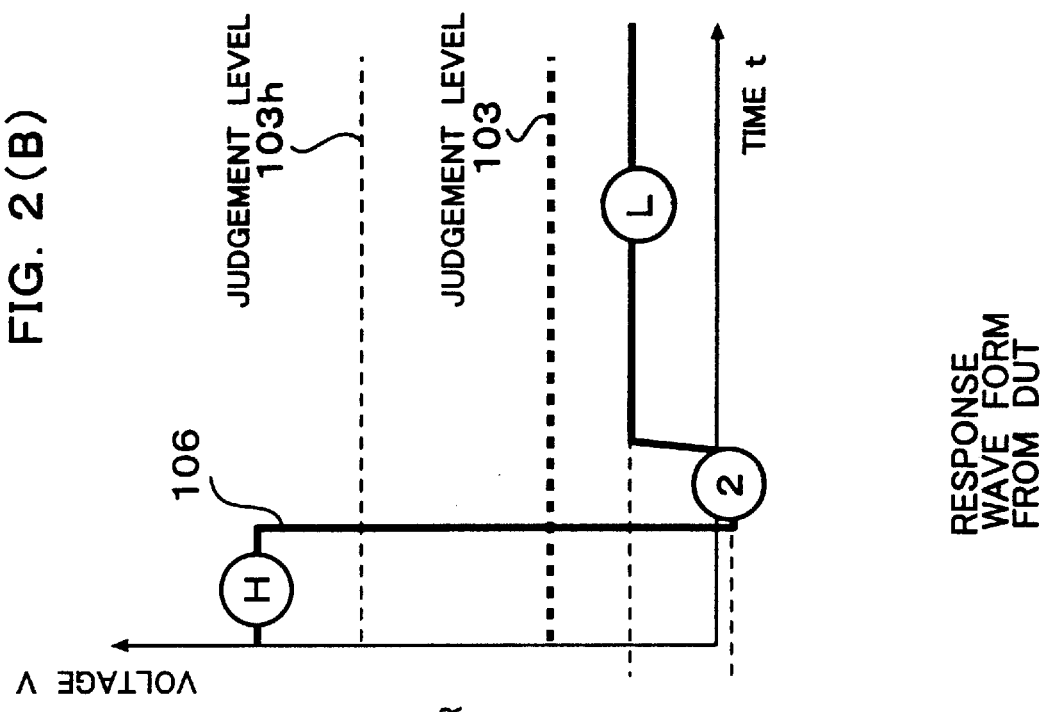
Figure 2A:
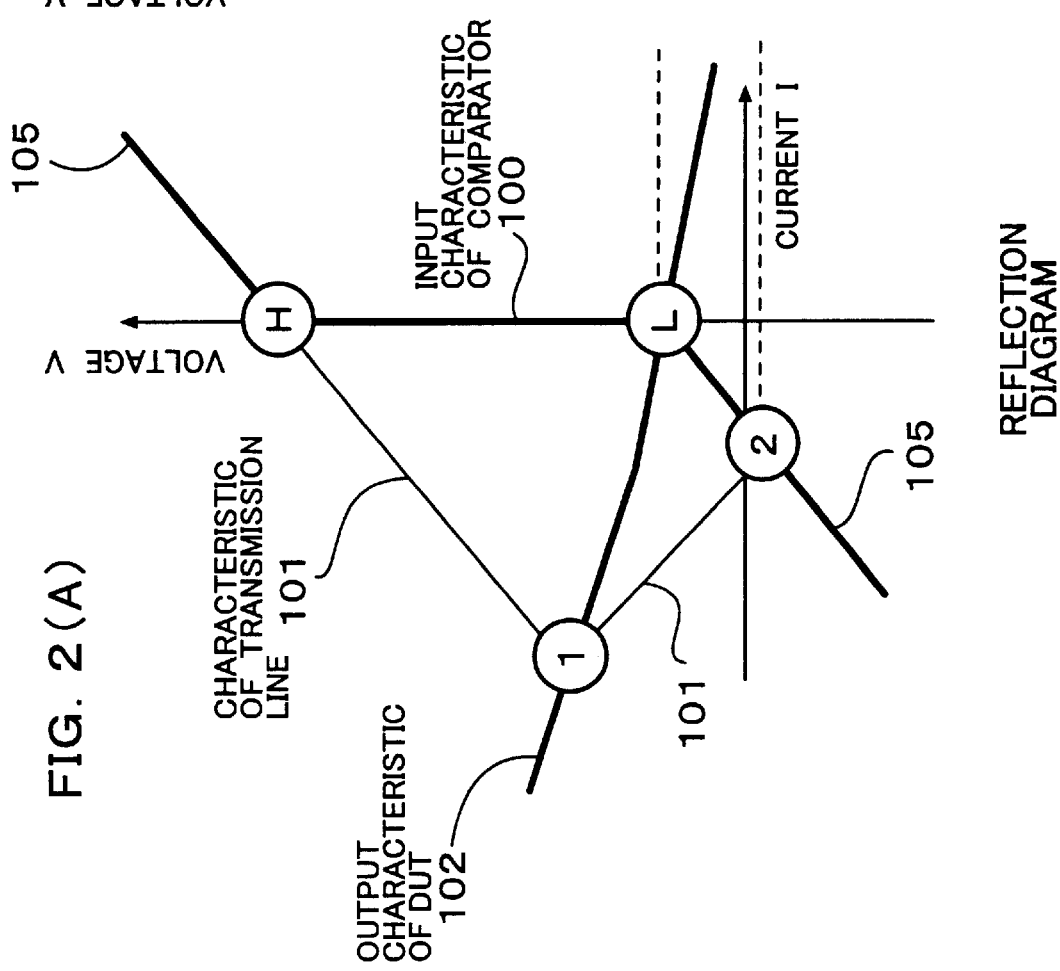

FIGS. 2(a) and 2(b) illustrate the function of such multiple reflection restricting circuit 13 with a reflection diagram and a response waveform, which correspond to those shown in FIGS. 9(a) and 9(b). Incidentally, it is assumed in FIGS. 2(a) and 2(b) that the voltage of the variable voltage source 134 is set to (ground potential +0.7V) and the voltage of the variable voltage source 137 is set to (5−0.7)V.

In FIG. 2(a), abscissa indicates current I and ordinate indicates voltage V and FIG. 2(b) shows the waveform 10a of the DUT 151 at the input terminal of the analog comparator 11 with voltage V on ordinate and time t on abscissa. A thick line segment 100 showing the input characteristics of the analog comparator 11, line segments 101 showing the characteristic impedance of the transmission line and a thick line segment 102 showing the output resistance of the DUT 151 shown in FIG. 2(a) are the same as those shown in FIG. 9(a). Further, the voltage levels of the response waveform 10a in the output levels H and L of the DUT 151 on the side of the analog comparator 11 are H and L, respectively.

By the provision of the multiple reflection restricting circuit 13, an impedance equal to the characteristic impedance of the transmission line 14 is added to the transmission line 14 when the transistor 132 or 135 is turned ON. Therefore, the input resistance of the analog comparator 11 becomes a sum of the input resistances of the analog comparator 11 and the multiple reflection restricting circuit 13 as shown by thick line segments 105 shown in FIG. 2(a).

As mentioned previously, the combined resistance value of the additional resistance in the multiple reflection restricting circuit 13 and the ON resistance of the transistor 132 or 135 is made equal to the characteristic impedance of the transmission line 14 when the level of the response waveform is higher than the "H" of the DUT 151 or lower than the "L" of the DUT 151. Therefore, the output voltage of the DUT 151 is not reflected multiply through a cross point between the line 101 showing the characteristic impedance Zo of the transmission line 14 and the line 102 showing the output characteristics of the DUT 151 since the response waveform 10a is clamped at the ground potential by the voltage of the variable voltage source 134 and absorbed, when the transistor 132 is turned ON. Consequently, a large ringing due to next multiple reflection is restricted and fixed to the L level of the analog comparator 11. Since a base-emitter forward voltage drop (1 Vf) is usually 0.7V and the voltage of the variable voltage source 134 is set to (ground potential +0.7 V), the voltage at the junction point N is clamped to the ground potential, which is lower than this setting voltage by 0.7V.

As a result, the level of the response waveform becomes L through a route H -①-②- L. Therefore, the response waveform 106 (=response waveform 10a) of the DUT 151 does not exceed the L level judging voltage 103 of the analog comparator 11 as shown in FIG. 2(b) and there is no possibility of erroneous judgement by ringing due to multiple reflection.

In a case where the output level of the DUT 151 is changed from L to H, the matching with respect to the impedance of the transmission line is performed similarly and the response waveform 10a is clamped to 5508 V(=4.3V +0.7V) by the voltage of the variable voltage source 137. Therefore, multiple reflection is absorbed, so that large ringing due to next multiple reflection is restricted to remove the possibility that the H level becomes lower than the judgement level 103h on the High side, shown in FIG. 2(b).

In this manner, it is possible to restrict ringing due to multiple reflection between the DUT 151 and the pin electronics circuit 1 to thereby obtain an acceptable test waveform by the multiple reflection restricting circuit 13 having the H side clamp voltage switch circuit and the L side clamp voltage switch circuit.

Figure 4:
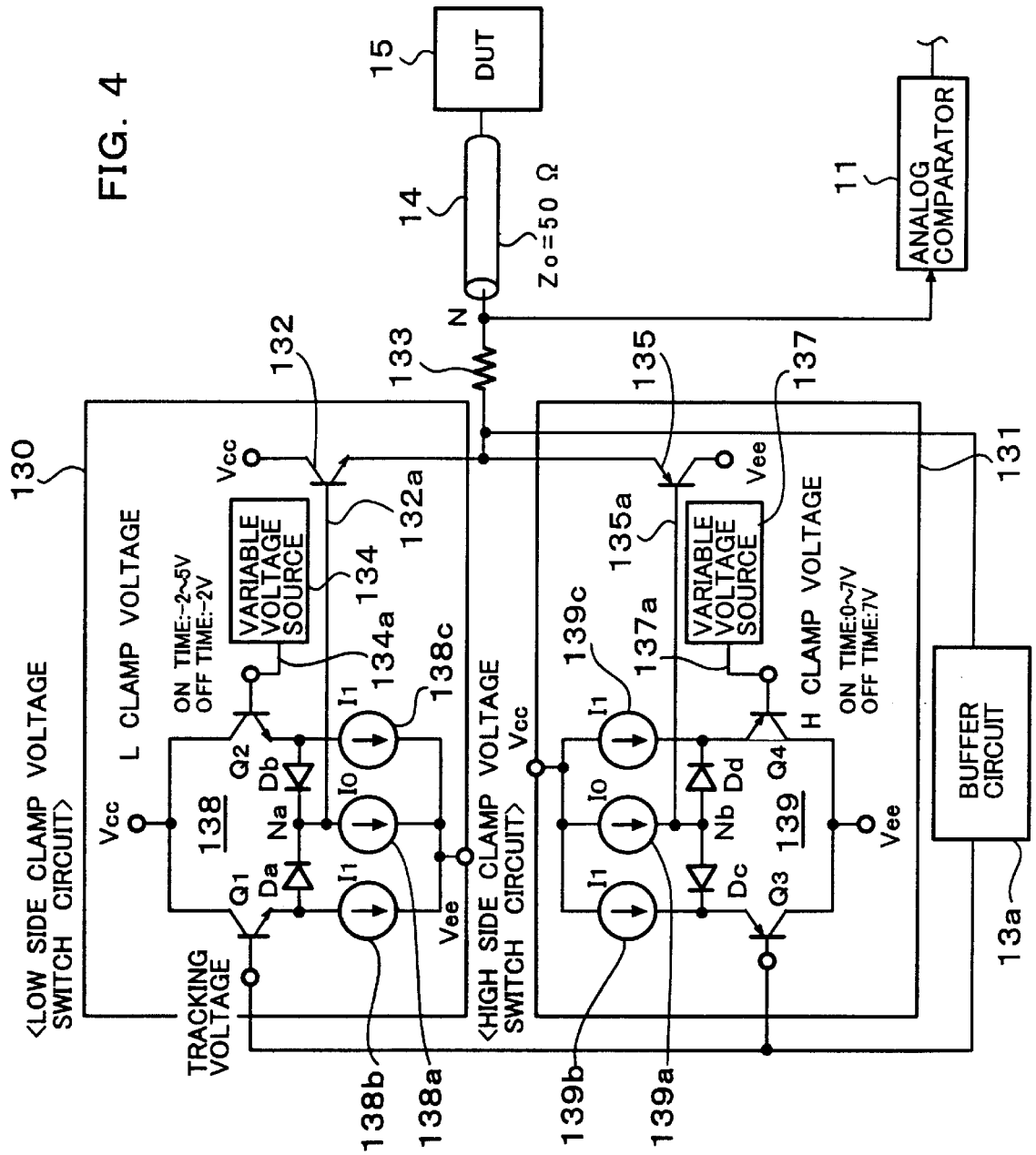
FIG. 4 is a circuit diagram showing another embodiment of the multiple reflection restricting circuit.

FIG. 4 shows another embodiment of the multiple reflection restricting circuit. In this embodiment, clamp voltage switching circuits 138 and 139 are used instead of the High side clamp voltage switch circuit 131 and the Low side clamp voltage switch circuit 130, shown in FIG. 1, respectively. The voltage of the variable voltage source 134 is set such that the response waveform from the transmission line 14 is clamped to, for example, the ground potential, which is the L level of the DUT and the voltage of the variable voltage source 137 is clamped to 5V, which is the H level of the DUT. Therefore, as to be described in detail later, a setting voltage output 134a of the Low side clamp voltage switch circuit 134 is 3 Vf=2.1 V and a setting voltage output 137a of the variable voltage source 137 becomes 5V−3 Vf=2.9V Incidentally, the setting voltage 3 Vf of the setting voltage output 134a of the variable voltage source 134 results from the fact that the voltage applying points of the variable voltage sources 134 and 137 are shifted with respect to the junction point N of the transmission line 14 by 3 Vf due to the provision of the clamp voltage switch circuits.

Figure 1:
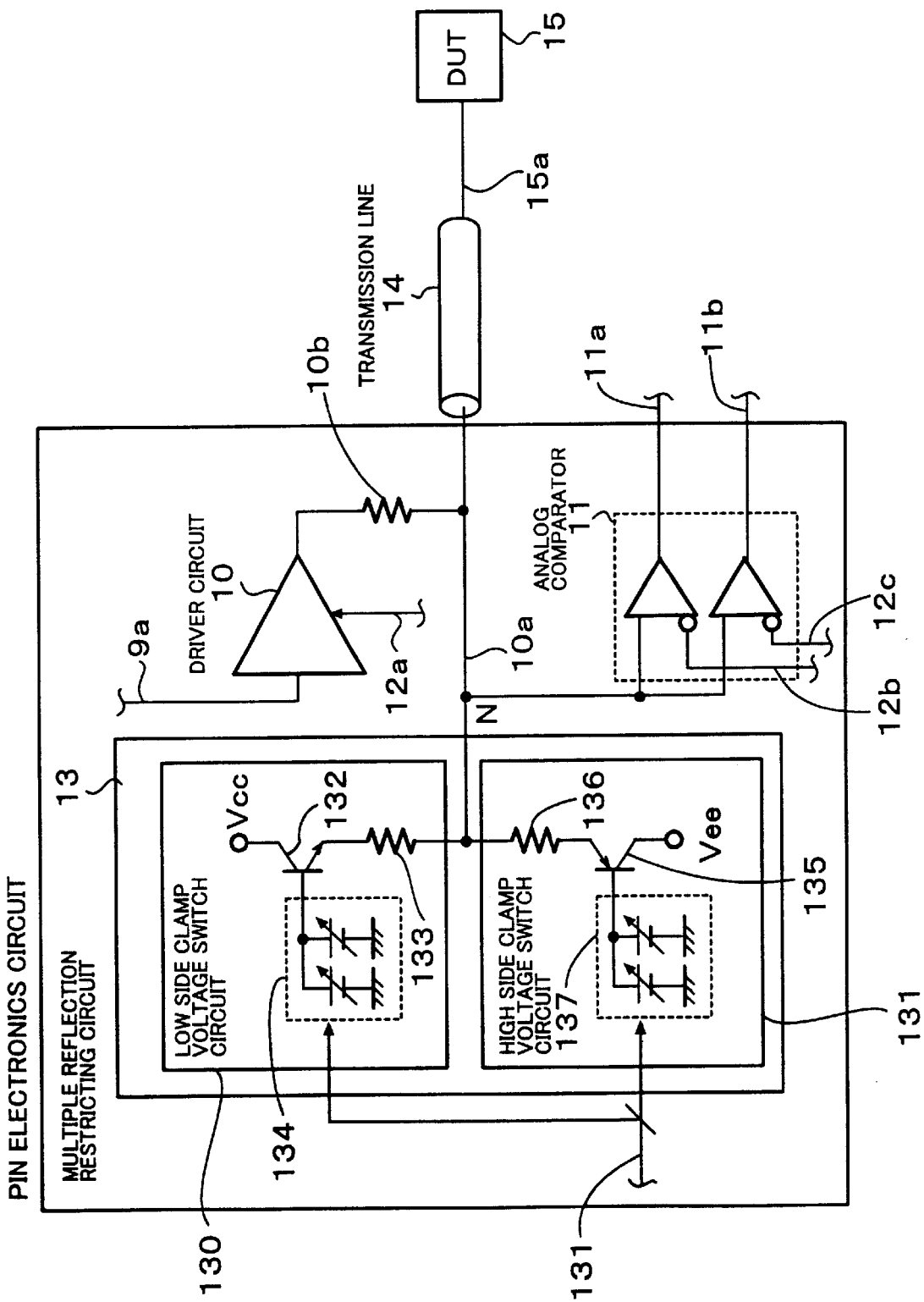
FIG. 1 is a circuit diagram of a pin electronics circuit and peripheral circuits related thereto, applied to an IC tester according to an embodiment of the present invention.

In FIG. 4, similar constructive components to those shown in FIG. 1 are depicted by same reference numerals, respectively, without description thereof. In the embodiment shown in FIG. 4, the resistor 136 shown in FIG. 1 is removed and, instead, the emitters of the transistors 132 and 135 are connected together to the junction point N through the resistor 133.

In order to prevent reverse voltages equal to or higher than a constant voltage from being applied between the bases and the emitters of the transistors 132 and 135 in the circuit shown in FIG. 4, the clamp voltage switch circuits 138 and 139 each constructed with a current switch circuit are connected between the base of the transistor 132 and the variable voltage source 134 and between the base of the transistor 135 and the variable voltage source 137, respectively, such that, when a large reverse voltage is applied between the emitter and the base of one of the transistors 132 and 135 due to the level of the response waveform 10a higher or lower by the predetermined, the base input voltage of the one transistor is switched by applying the reverse voltage to one input of one of the clamp voltage switch circuits 138 and 139 through a buffer circuit 13a. That is, the setting voltage of the variable voltage source 134 is applied to the other input of the clamp voltage switch circuit 138 and the setting voltage of the variable voltage source 137 is applied to the other input of the clamp voltage switch circuit 139. When the voltage of the output of the buffer circuit 13a, which is supplied to the one inputs of the clamp voltage switch circuits 138 and 139, becomes higher or lower by the predetermined value, the input voltages of the bases of the transistors 132 and 135 are switched to voltages corresponding to the output voltage of the buffer circuit 13a by switching the base input voltages of the transistors 132 and 135 to the output voltage of the buffer circuit 13a.

The buffer circuit 13a is a voltage-follower circuit, which outputs the voltage level of the response waveform 10a of the DUT 151 to the one inputs of the clamp voltage switch circuits 138 and 139. An input of the buffer circuit 13a is connected to the junction point N through the resistor 133.

The Low side clamp voltage switch circuit 138 and the High side clamp voltage switch circuit 139 are current switch circuits, respectively. In the Low side clamp voltage switch circuit 138, the output voltage of the buffer circuit 13a is compared with the voltage of the variable voltage source 134 to switch the setting voltage of the base of the transistor 132 to a higher voltage when the output voltage of the buffer circuit 13a, that is, the emitter voltage of the transistor 132, becomes higher than the output voltage of the variable voltage source 134. In the High side clamp switch circuit 139, the output voltage of the buffer circuit 13a is compared with the voltage of the variable voltage source 137 to switch the setting voltage of the base of the transistor 135 to a lower voltage when the output voltage of the buffer circuit 13a, that is, the emitter voltage of the transistor 135, becomes lower than the output voltage of the variable voltage source 137.

The Low side clamp voltage switch circuit 138 includes NPN type differential transistors Q1 and Q2 having collectors connected to the power source line Vcc and the emitters connected to a common current source 138a supplying a current Io through respective diodes Da and Db, which are forward-connected to the respective transistors Q1 and Q2. The output of the constant current source 138a is connected to the negative power source line Vee. Further, the emitters of the transist Q2 are connected to respective constant current sources 138b supplying a current I1 and 138c supplying a current I1. Outputs of the constant current sources 138b and 138c are connected to the negative power source line Vee. The base of the transistor 132 is connected to a junction point Na between the diodes Da and Db.

The cathodes of the diodes Da and Db are connected to the constant current source 138a and constitute a diode switch for selecting one of the inputs of the constant current sources 138a, 138b and 138c.

The High side clamp voltage switch circuit 139 includes PNP type differential transistors Q3 and Q4 having collectors connected to the negative power source line Vee and the emitters connected to an output of a common current source 139a supplying a current Io through respective diodes Dc and Dd, which are forward-connected to the respective transistors Q3 and Q4. An input of the constant current source 139a is connected to the power source line Vcc. Further, the emitters of the transistors Q3 and Q4 are connected to outputs of respective constant current sources 139b supplying a current I1 and 139c supplying a current I1. The base 135a of the transistor 135 is connected to a junction point Nb between the diodes Da and Db.

The anodes of the diodes Dc and Dd are connected to the constant current source 139a and constitute a diode switch for selecting one of the inputs of the constant current sources 139a, 139b and 139c.

In the clamp voltage switch circuits 138 and 139 having the current switching switch functions, the transistors Q1 and Q2 or Q3 and Q4 having the independent current sources each supplying the current I1 are in ON state and, so, the diode switch is ON/OFF switched according to the voltage level at the bases of the differential transistors.

In the Low side clamp voltage switch circuit 138, there is a problem of breakdown voltage when the emitter voltage of the transistor 132 becomes higher than the base voltage thereof. In order to solve this problem, a voltage lower than the emitter voltage of the transistor 132 of the clamp voltage switch circuit 130 by a predetermined value (2 Vf in this example) is added to the base of the transistor 132 when the emitter voltage thereof exceeds a sum of 2 Vf and the base setting voltage of the transistor 132. That is, the current switching operation is performed by turning OFF of the diode Db, which is connected to the emitter of the differential transistor Q2 having the base whose voltage is lower than the base voltage of the differential transistor Q1 and is reverse-biased, and turning ON of the diode Da, which is connected to the emitter of the differential transistor Q1 having the higher base voltage, when the emitter voltage of the transistor 132 of the clamp voltage switch circuit 138 becomes higher than the base setting voltage by 2 Vf or more and the base voltage of the differential transistor Q1 is increased. In this case, the voltage which is lower than the emitter voltage of the transistor 132 is applied to the base of the same transistor, depending upon the value of the emitter voltage of the transistor 132.

In the High side clamp voltage switch circuit 139, there is a problem of breakdown voltage when the emitter voltage of the transistor 135 becomes lower than the base voltage thereof. In order to solve this problem, a voltage lower than the emitter voltage of the transistor 135 of the clamp voltage switch circuit 131 by a predetermined value (2 Vf in this example) is added to the base of the transistor 135 when the emitter voltage thereof becomes lower than a sum of −2 Vf and the base setting voltage of the transistor 135. That is, the current switching operation is performed by turning OFF of the diode Dd, which is connected to the emitter of the differential transistor Q4 having the higher base voltage and is reverse-biased, and turning ON of the diode Dc, which is connected to the emitter of the differential transistor Q3 having the lower base voltage. In this case, the voltage which is higher than the emitter voltage of the transistor 135 by 2 Vf is applied to the base of the same transistor, depending upon the value of the emitter voltage of the transistor 135.

In the described case, the switched current Io of one of the differential transistors of the Low side clamp voltage switch circuit 138 flows into the current source 138a and the High side clamp voltage switch circuit 139 receives the current Io from the current source 139a. The junction point Na of the Low side clamp voltage switch circuit 138 is clamped at the voltage lower than the higher emitter voltage of the transistor 132 by 2 Vf and the junction point Nb of the High side clamp voltage switch circuit 139 is clamped at the voltage higher than the lower emitter voltage of the transistor 135 by 2 Vf.

Assuming that the voltage drop of the resistor 133 is negligible, the transistor 132 of the Low side clamp voltage switch circuit 138 is reverse-biased and turned OFF at a time when the voltage of the junction point N on the side of the transmission line 14 exceeds the voltage 2.1V of the variable voltage source 134 since the voltage equal to a sum of the voltage of the junction point N and −2 Vf is added to the base of the transistor 132. Since the emitter of the transistor 132 is connected to the junction point N, the reverse voltage Vbe between the base and emitter of the transistor 132 becomes 2 Vf and does not exceeds this voltage.

On the other hand, the transistor 135 of the High side clamp voltage switch circuit 139 is reverse-biased and turned OFF at a time when the voltage of the junction point N becomes lower than the voltage 2.9V of the variable voltage source 137 since the voltage equal to a sum of the voltage of the junction point N and 2 Vf is added to the base of the transistor 135. Since the emitter of the transistor 135 is connected to the junction point N, the reverse voltage between the base and emitter of the transistor 135 becomes 2 Vf and does not exceeds this voltage.

Therefore, in either case, the reverse breakdown voltage equal to 2 Vf or more is not applied between the base-emitter circuit of the transistor 132 or 135.

Consequently, degradation or breakdown of the transistors 132 and 135 due to the reverse voltage Veb does not occur.

It is possible to regulate the reverse breakdown voltage by taking the voltage drop of the resistor 133, which is neglected in the above description, into consideration. It is further possible to directly connect the input of the buffer circuit 13a to the junction point N.

Now, an operation of the whole IC tester will be described. The resistor 133 functions to make the ON resistance of the Low or High side clamp voltage switch circuit 130 or 131 equal to the characteristic impedance of the transmission line 14 and, in this embodiment, is common for the Low and High side clamp voltage switch circuits. First, the buffer circuit 13a having voltage gain 1 and receiving low input current always detects the voltage level of the response waveform 10a of the DUT 151 and outputs the detected voltage value to the clamp voltage switch circuits 138 and 139. The clamp voltage switch circuits 138 and 139 operate to prevent the reverse voltage equal to 2 Vf or more from being applied between the bases and the emitters of the transistors 132 and 135 thereof. Incidentally, in order to keep the input resistance of the buffer circuit 23a large when the clamp voltage switch circuits are in OFF states, a low input current buffer is used as the buffer circuit 13a.

Describing the operation by using a concrete example of voltage values, the Low side clamp voltage is 0V and the High side clamp voltage is 5V.

Assuming that the ON voltage Vbe of the transistor 132 (or 135), that is, the base-emitter voltage of the transistor 132 (or 135) when it is turned ON, is 0.7V, the setting voltage 132a of the base of the transistor 132 of the Low side clamp voltage switch circuit 130 is set to 0.7V and the setting voltage 135a of the base of the transistor 135 of the High side clamp voltage switch circuit 131 is set to 4.3V. Therefore, as mentioned previously, the voltage of the variable voltage source 134 becomes 0.7V+2 Vf=2.1V and the voltage of the variable voltage source 137 becomes 4.3V−2 Vf=2.9V.

In this case, if Schottky diodes are used as the diodes Da, Db, Dc and Dd, respectively, the voltage drop of each diode becomes about 0.3V. Therefore, the reverse breakdown voltage can be further reduced to about 1.0V, preferably.

Assuming that the setting voltage 132a (0.7V) and the setting voltage 134a (4.3V) are always supplied to the bases of the transistors 132 and 135, respectively, without using the clamp voltage switch circuits, reverse voltage is applied between the base and the emitter of the transistor 132 or 135 due to the response waveform 10a of the DUT 151. For example, when the output voltage 10a of the DUT 151 is 5V, the input voltage of the analog comparator 11 is 5V. When the base input 132a of the Low side transistor 132 is 0.7V which is the same as the Low side clamp setting voltage 134a, a reverse voltage of 4.3V is applied between the base and the emitter of the transistor 132. Similarly, when the output voltage 10a of the DUT 151 is 0V, a reverse voltage of 4.3V is applied between the base and the emitter of the transistor 135. In general, the reverse breakdown voltage between a base and an emitter of a transistor is inverse proportional to the operating frequency limit of the transistor. That is, the higher the operating speed of the transistor is the lower the reverse breakdown voltage. Further, since the base-emitter reverse breakdown voltage is about 2.5V when the cut-off frequency fo of the transistor is 10 GHz, it is necessary, in order to obtain a high operating speed of the clamp circuit and to expand he input voltage range thereof, that it does not exceed the base-emitter reverse breakdown voltage regardless of condition.

Figure 5A:
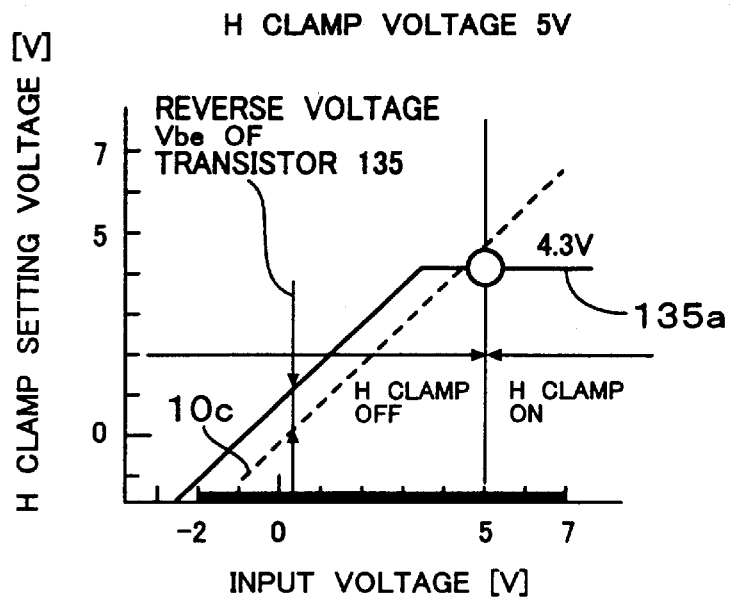

In order to accommodate to this necessity, the construction shown in FIG. 4 is preferable. The voltage switching operation of the High side clamp voltage switch circuit will be described with reference to FIG. 5(a). In FIG. 5(a), a dotted line 10c indicates the input voltage of the transistor 135 supplied through the buffer circuit 13a. The High side clamp setting voltage 137a is 4.3V. The High side clamp voltage switch circuit 139 selects one of the input voltage 10c and the High side clamp setting voltage 137a, which is lower than the other, by the switching operation of the current switch circuit and outputs a voltage shown by a thick solid line, which is lower than the selected voltage by 2 Vf, to the base of the transistor 135.

Considering a case where the base voltage of the transistor 135 is changed from −2V to 5V due to the response waveform 10b, the input voltage 10b becomes 5V and the base-emitter voltage of the transistor 135 becomes 0.7V. Therefore, the transistor 135 is turned ON and absorbs multiple reflection components. On the other hand, when the input voltage 10b is in a range from 4.3V to 5V, a reverse breakdown voltage of 0.7 at maximum is applied to the transistor 135, causing the latter to be OFF. When the input voltage 10b is lower than 4.3V, the transistor 135 is in OFF state since the same voltage as the emitter voltage is applied to the base thereof.

Figure 5B:
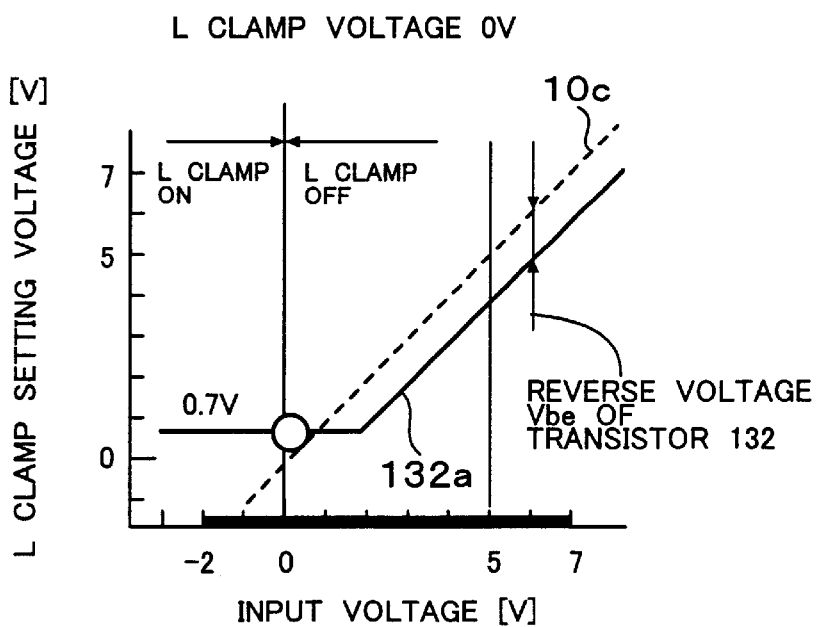

Similarly, FIG. 5(b) shows the voltage switching operation of the Low side clamp voltage switch circuit. In FIG. 5(b), the Low side clamp voltage switch circuit 138 selects one of the input voltage 10c and the Low side clamp setting voltage 134a, which is higher than the other, by the switching operation of the current switch circuit and outputs a voltage shown by a thick solid line, which is higher than the selected voltage by 2 Vf, to the base of the transistor 132. The transistor 132 is turned ON with the base voltage lower than 0V and turned OFF with the base voltage higher than 0V.

In FIG. 4, both the Low side clamp voltage switch circuit and the high side clamp voltage switch circuit are connected to the junction point N through the common resistor 133. However, it is possible to connect the transistor 132 to the junction point N through the resistor 133 and to connect the transistor 135 to the junction point N through the resistor 136 as shown in FIG. 1. In such case, the input voltage of the buffer circuit 13a may be the potential at the junction point N. In the case shown in FIG. 4, the input voltage of the buffer circuit 13a may also be the potential at the junction point N.

Figure 6:
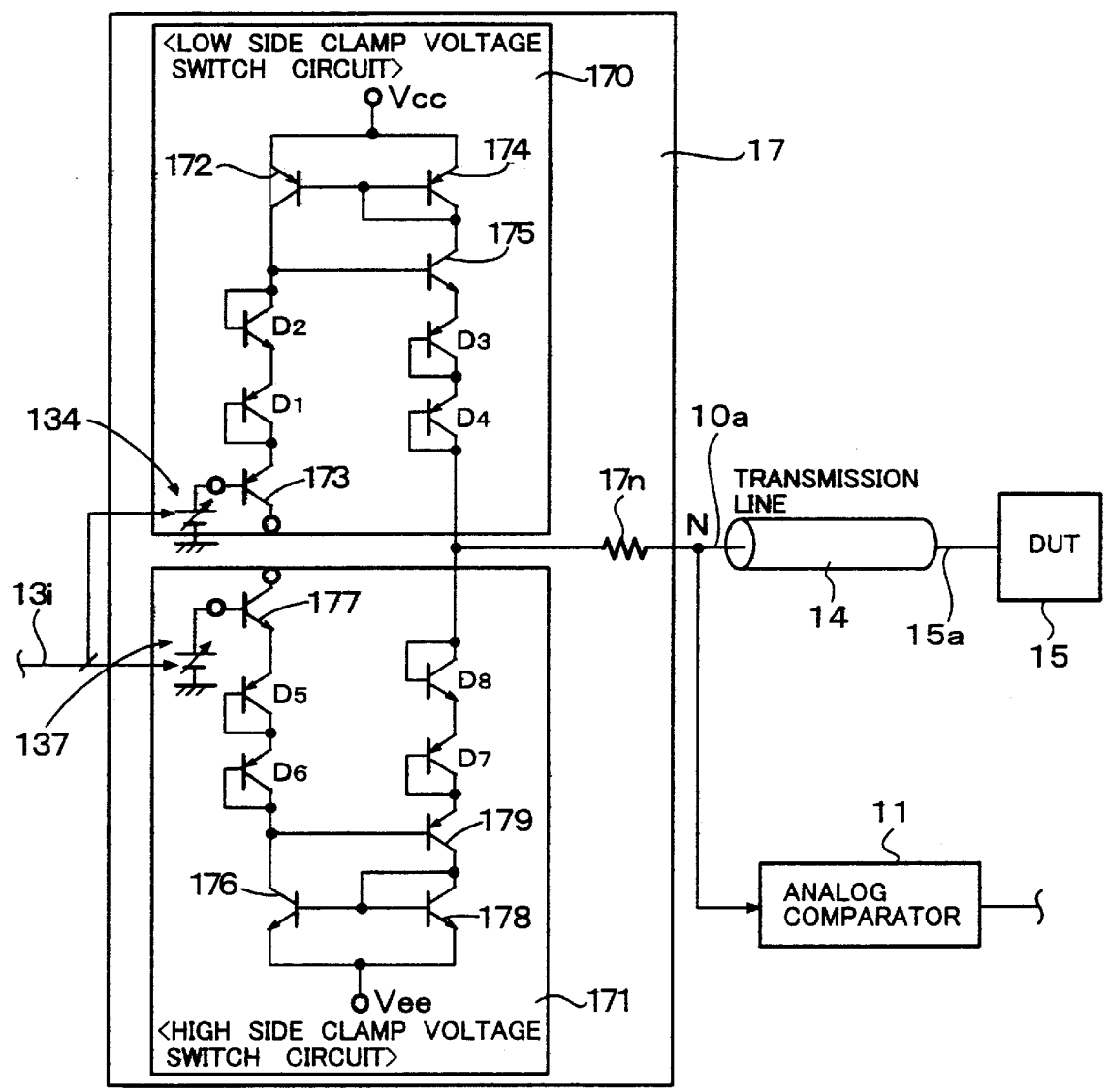
FIG. 6 shows a multiple reflection restricting circuit constructed with current mirror circuits.

FIG. 6 shows an example of a concrete construction of the multiple reflection restricting circuit constructed with the current mirror circuit.

In FIG. 6, the multiple reflection restricting circuit 17 includes a Low side clamp voltage switch circuit 170, a High side clamp voltage switch circuit 171 and an input resistance regulating resistor 17n. In this embodiment, the voltages of the variable voltage sources 134 and 137 are regulatable in only positive direction.

In the Low side clamp voltage switch circuit 170, a PNP transistor 172 in an input side of the current mirror circuit has an emitter connected to the power source line Vcc. An input PNP transistor 173 has an emitter connected to a collector of the transistor 172 through level shift diodes (diode-connected transistors) D1 and D2 to pull a drive current from the transistor 172 and a base connected to the variable voltage source 134.

An output side PNP transistor 174 of the current mirror circuit has an emitter connected to the power source line Vcc. An NPN transistor 175 has an emitter connected to a collector of the transistor 174 correspondingly to the transistor 173. Forward-connected level shift diodes (diode-connected transistors) D3 and D4 are connected to the transistor 175. The level shift diode D4 is connected to the junction point N through the input resistance regulating resistor 17n to match potential level between the input and output sides.

Similarly, in the High side clamp voltage switch circuit 171, a NPN transistor 176 in an input side of the current mirror circuit has an emitter connected to the negative power source line Vee. An input NPN transistor 177 has an emitter connected to a collector of the transistor 176 through level shift diodes (diode-connected transistors) D5 and D6 to add a drive current to the transistor 176 and a base connected to the variable voltage source 137.

An output side NPN transistor 178 of the current mirror circuit has an emitter connected to the negative power source line Vee. An NPN transistor 179 has an emitter connected to a collector of the transistor 178 correspondingly to the transistor 177. Forward-connected level shift diodes (diode-connected transistors) D7 and D8 are connected to the transistor 179. The level shift diode D8 is connected to the junction point N through the input resistance regulating resistor 17n to match potential level between the input and output sides.

Incidentally, the collectors of the driving transistors 173 and 177 are connected to suitable bias lines, respectively.

This clamp voltage switch circuit having the current mirror circuit construction is featured by that current ratio of a preceding stage circuit thereof can be changed with respect to a succeeding stage circuit, so that it is possible to reduce current consumption of the variable voltage sources 134 and 137. Further, since the voltage drop Vbe of the transistor of the preceding stage circuit is the same as that of the transistor of the succeeding stage circuit, it is possible to make the clamp voltage equal to the setting voltage of the variable voltage source to thereby facilitate the setting of the clamp voltage. Further, the reverse voltage between the base and emitter of the transistor in the OFF state is applied across the three-stage transistor circuit, the reverse voltage becomes high, so that multiple reflection can be prevented in a wide voltage range without necessity of correction of the reverse breakdown voltage by the feedback circuit employed in the embodiment shown in FIG. 4.

Figure 7:
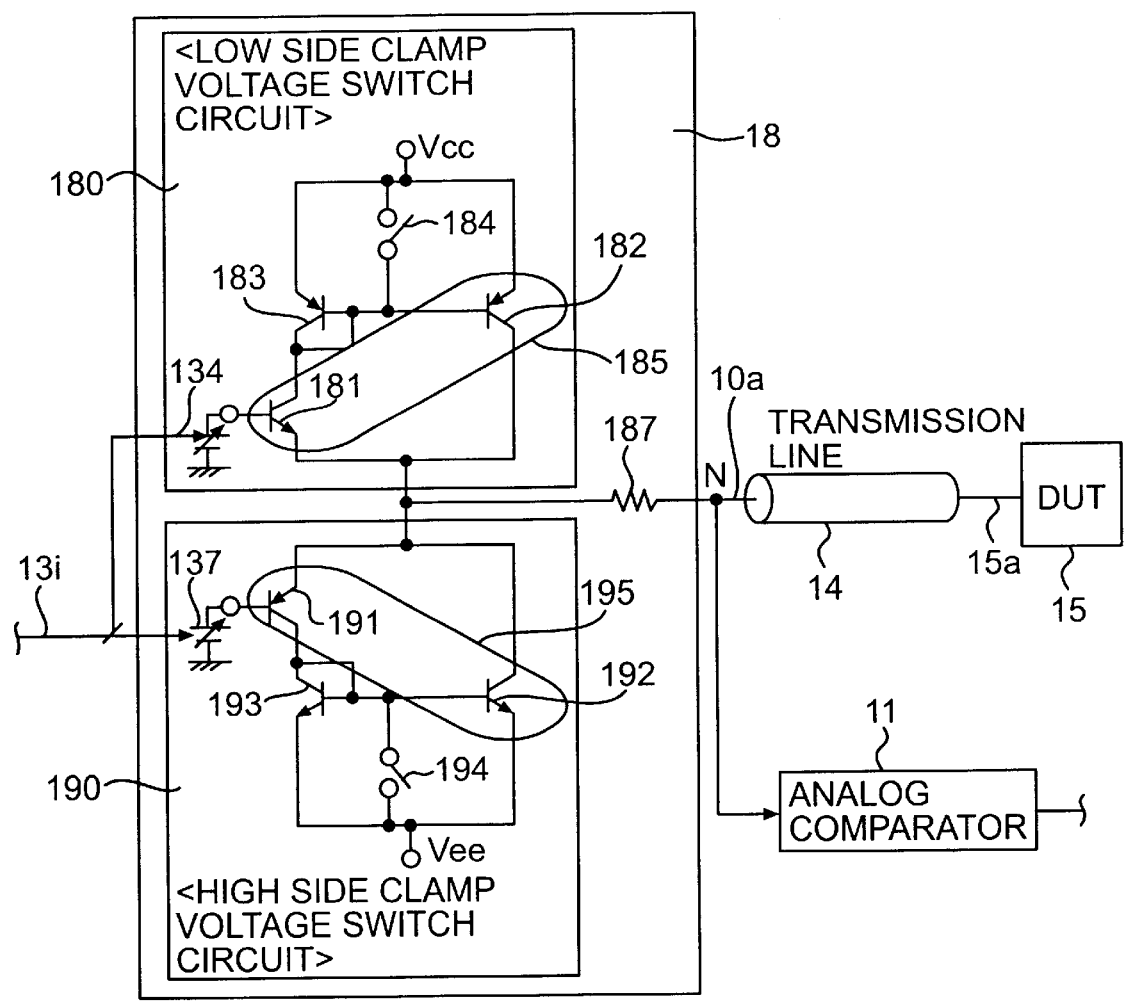
FIG. 7 shows a multiple reflection restricting circuit of inverted Darlington type.

FIG. 7 shows another example of the multiple reflection restricting circuit, which employs inverted-Darlington circuits.

In FIG. 7, the multiple reflection restricting circuit 18 includes a Low side clamp voltage switch circuit 180, a High side clamp voltage switch circuit 181 and an input resistance regulating resistor 187.

In the Low side clamp voltage switch circuit 180, a PNP transistor 183 in an input side of a current mirror circuit has an emitter connected to the power source line Vcc. An input stage NPN transistor 181 has a collector connected to a collector of the transistor 183, an emitter connected to the junction point N through the resistor 187 and a base connected to the variable voltage source 134 and functions to pull a drive current from the transistor 183.

A PNP transistor 182 of the output side of the current mirror circuit is an output transistor corresponding to the transistor 132 shown in FIG. 4. The transistor 182 has an emitter connected to the power source line Vcc, a collector connected to the junction point N through the resistor 187 and a base connected to a base and the collector of the transistor 183. A switch circuit 184 is connected between the power source line Vcc and the base of the transistor 182.

Similarly, in the High side clamp voltage switch circuit 190, an NPN transistor 193 in an input side of a current mirror circuit has an emitter connected to the power source line Vcc. An input stage PNP transistor 191 has a collector connected to a collector of the transistor 193, an emitter connected to the junction point N through the resistor 187 and a base connected to the variable voltage source 137 and functions to add a drive current from the transistor 193.

An NPN transistor 192 of the output side of the current mirror circuir is an output transistor corresponding to the transistor 135 shown in FIG. 4. The transistor 192 has an emitter connected to the negative power source line Vee, a collector connected to the junction point N through the resistor 187 and a base connected to a base and the collector of the transistor 193. A switch circuit 194 is connected between the negative power source line Vee and the base of the transistor 192.

This clamp voltage switch circuit is featured by including an inverted-Darlington connection 185 composed of the transistor 181 and the transistor 182 connected to the transistor 181 through the transistor 183 and an inverted-Darlington connection 195 composed of the transistor 191 and the transistor 192 connected to the transistor 191 through the transistor 193. With this circuit construction, it is possible to make the current ratio of a preceding stage circuit and a succeeding stage circuit large. Therefore, it becomes possible to reduce circuit currents of the variable voltage sources 134 and 137 to thereby make the constructions of the variable voltage sources simpler.

The switch circuits 184 and 194 are turned ON when the operations of the Low side clamp voltage switch circuit 180 and the High side clamp voltage switch circuit 190 are to be stopped, to turn the transistors of the current mirror circuit OFF, respectively.

Figure 8:
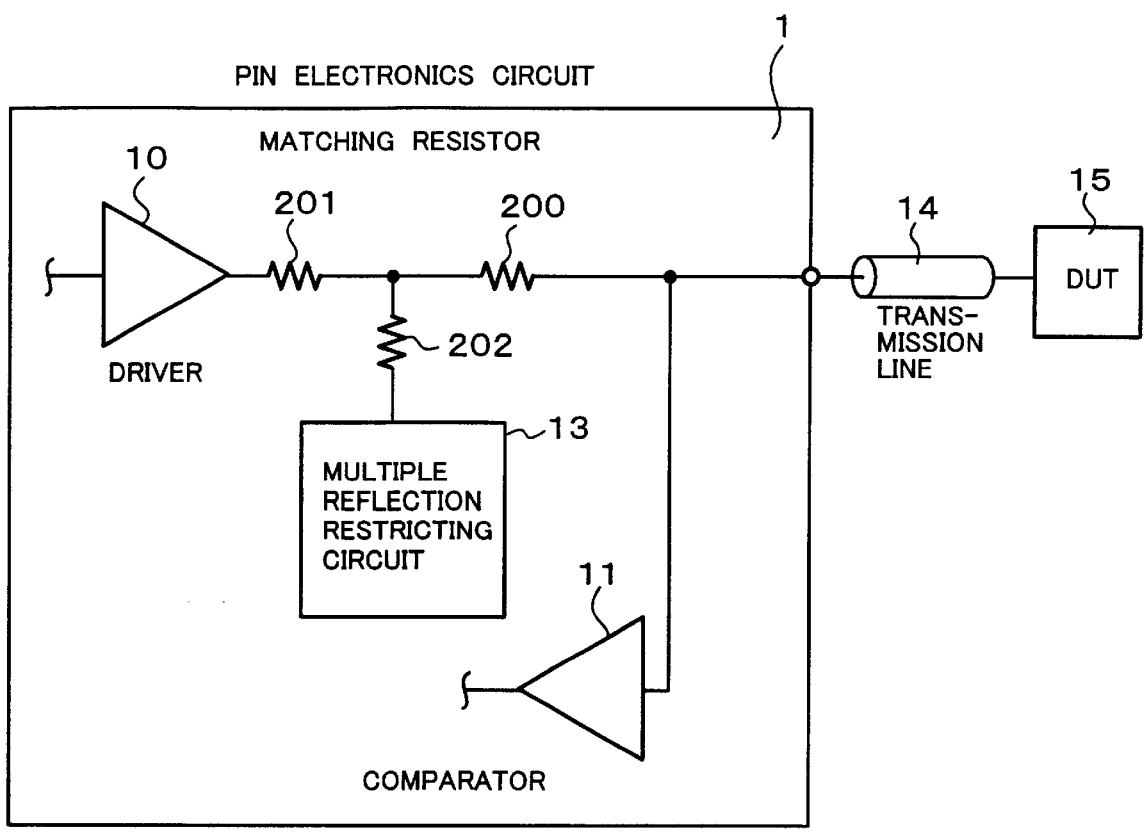
FIG. 8 shows a connection of the multiple reflection restricting circuit.

FIG. 8 shows an example of a connection of the multiple reflection restricting circuit in the pin electronics circuit 1.

In this example, the driver circuit 10 of the pin electronics circuit 1 is connected to the transmission line 14 through three impedance matching resistors 200, 201 and 202, which constitute a T type circuit.

An output impedance of the driver circuit 10 is matched with the characteristic impedance of the transmission line 14 by the resistors 200 and 201 and the input impedance of the multiple reflection restricting circuit 13 is matched with the characteristic impedance of the transmission line 14 by the resistors 200 and 202. In this case, the value of the matching resistor 200 is the largest among others.

That is, it is possible to provide the multiple reflection restricting circuit 13 in the vicinity of the output terminal of the driver circuit 10 by making the value of the resistor 202 zero when the output resistance of the driver circuit 10 is smaller than the input impedance of the multiple reflection restricting circuit 13 or making the value of the resistor 201 zero when the output resistance of the driver circuit 10 is larger than the input impedance of the multiple reflection restricting circuit 13. With the provision of the multiple reflection restricting circuit 13 in the vicinity of the output terminal of the driver circuit 10, it is possible to reduce degradation of the output waveform of the driver circuit due to parasitic capacitance of the multiple reflection restricting circuit 13.

It should be noted that the circuits described hereinbefore are basic or principled circuits and can be modified in various manner within the true scope of the present invention defined by the appended claims. For example, it may be possible to connect various resistors and/or capacitors to transistors of the circuits concomitantly with bias settings or specific regulations of operations thereof. Further, it may be possible to additionally provide various characteristics correcting circuits.

Further, the transistors used in the present invention are not limited to bipolar transistors and other transistors such as MOS transistors may be used instead thereof.

What is claimed is:

1. A semiconductor device tester for judging a state of a semiconductor device under test by supplying a predetermined test waveform from a driver circuit provided in a pin electronics circuit to said semiconductor device under test through a transmission line, receiving the response waveform from said semiconductor device through said transmission line after a predetermined time from the supply of the predetermined test waveform to said semiconductor device and comparing a state of the response waveform with a predetermined voltage level by an analog comparator, said semiconductor device tester comprising:

a first switch circuit connected between said transmission line and an input terminal of said analog comparator, said first switch circuit being adapted to be turned ON according to a change of the response waveform from High level to Low level to connect an impedance substantially equal to a characteristic impedance of said transmission line to said transmission line;

a second switch circuit connected between said transmission line and said input terminal of said analog comparator, said second switch circuit being adapted to be turned ON according to a change of the response waveform from Low level to High level to connect an impedance substantially equal to the characteristic impedance of said transmission line to said transmission line;

a first voltage generator circuit connected to said first switch circuit for generating a voltage for clamping the level of the response waveform at a certain Low level; and a second voltage generator circuit connected to said second switch circuit for generating a voltage for clamping the level of the response waveform at a certain High level.

2. A semiconductor device tester as claimed in claim 1, wherein each of said first and second switch circuits is constructed with a transistor and the impedance substantially equal to the characteristic impedance of said transmission line includes an internal impedance of said transistor.

3. A semiconductor device tester for judging a state of a semiconductor device under test by supplying a predetermined test waveform from a driver circuit provided in a pin electronics circuit to said semiconductor device under test through a transmission line, receiving a response waveform from said semiconductor device through said transmission line after a predetermined time from the supply of the predetermined test waveform to said semiconductor device and comparing a state of the response waveform with a predetermined voltage level by an analog comparator, said semiconductor device tester comprising:

a first transistor connected between said transmission line and an input terminal of said analog comparator, said first transistor being adapted to be turned ON according to a change of the response waveform from High level to Low level for restricting multiple reflection of the response waveform by an output side internal impedance thereof or a combination of the output side internal impedance and an impedance connected in series with the output side internal impedance;

a second transistor connected between said transmission line and said input terminal of said analog comparator, said second transistor being adapted to be turned ON according to a change of the response waveform from Low level to High level for restricting multiple reflection of the response waveform by an output side internal impedance thereof or a combination of the output side internal impedance and an impedance connected in series with the output side internal impedance;

a first voltage generator circuit connected to said first transistor for generating a voltage for clamping the level of the response waveform at a certain Low level; and a second voltage generator circuit connected to said second transistor for generating a voltage for clamping the level of the response waveform at a certain High level.

4. A semiconductor device tester as claimed in claim 3, further comprising resistors connected between said transmission line and said first and second transistors, respectively, wherein said analog comparator judges the level of the response waveform, said first transistor has a control electrode connected to said first voltage generator circuit to form a clamp circuit for clamping the level of the response waveform at the certain Low level, said second transistor has a control electrode connected to said second voltage generator circuit to form a clamp circuit for clamping the level of the response waveform at the certain High level and a sum of a resistance of said resistor connected between said transmission line and each of said first and second transistors and an ON resistance of each of said first and second transistors is substantially equal to the characteristic impedance of said transmission line.

5. A semiconductor device tester as claimed in claim 4, wherein each of said first and second voltage generator circuits is a variable power source generating a voltage capable of being set externally, said first transistor is an NPN transistor, said second transistor is a PNP transistor, said control electrodes are bases of said first and second transistors and said impedance connected in series with the internal impedance includes resistors provided correspondingly to said first and second transistors, respectively.

6. A semiconductor device tester as claimed in claim 5, further comprising a first switch circuit provided between said base of said first transistor and said first voltage generator circuit, a second switch circuit provided between said base of said second transistor and said second voltage generator circuit and a buffer circuit for receiving a voltage at a junction point between said resistors or a voltage of said transmission line and outputting it to said first and second switch circuits, wherein said first switch circuit switches the base voltage of said first transistor from the voltage of said first voltage generator circuit to an output voltage of said buffer circuit when the output voltage of said buffer circuit exceeds at least the voltage of said first voltage generator circuit and said second switch circuit switches the base voltage of said second transistor from the voltage of said second voltage generator circuit to the output voltage of said buffer circuit when the output voltage of said buffer circuit lowers the voltage of said second voltage generator circuit.

7. A semiconductor device tester as claimed in claim 6, wherein each of said first and second switch circuits is constructed with a current switch circuit, said first switch circuit compares the output voltage of said buffer circuit with the voltage of said first voltage generator circuit and performs the switching operation according to a result of the comparison and said second switch circuit compares the output voltage of said buffer circuit with the voltage of said second voltage generator circuit and performs the switching operation according to a result of the comparison.

8. A semiconductor device tester as claimed in claim 7, wherein each of said current switch circuits includes a pair of differential transistors, a pair of diodes and a constant current source, emitters of said differential transistors of each of said current switch circuits are connected commonly to said constant current source through said diodes, respectively, a junction point between said constant current source and said diodes of said first switch circuit is connected to said base of said first transistor, the voltage of said buffer circuit is connected to the base of one of said differential transistors of said first switch circuit, the voltage of said first voltage generator circuit is connected to the base of the other differential transistor of said first switch circuit, a junction point between said constant current source and said diodes of said second switch circuit is connected to said base of said second transistor, the voltage of said buffer circuit is connected to the base of one of said differential transistors of said second switch circuit and the voltage of said second voltage generator circuit is connected to the base of the other differential transistor of said second switch circuit.

9. A semiconductor device tester as claimed in claim 5, further comprising first and second current mirror circuits, wherein said first and second transistors are output transistors of said first and second current mirror circuits, respectively.

10. A semiconductor device tester as claimed in claim 9, further comprising third and fourth transistors, wherein said third transistor has a base supplied with the voltage of said first voltage generator circuit to drive an input transistor of said first current mirror circuit and said fourth transistor has a base supplied with the voltage of said second voltage generator circuit to drive an input transistor of said second current mirror circuit.

11. A semiconductor device tester as claimed in claim 10, wherein said first and third transistors are inverted-Darlington connected through said input transistor of said first current mirror circuit and said second and fourth transistors are inverted-Darlington connected through said input transistor of said second current mirror circuit.

12. A multiple reflection restricting circuit of a semiconductor device tester for judging a state of a semiconductor device under test by supplying a predetermined test waveform from a driver circuit provided in a pin electronics circuit to said semiconductor device under test through a transmission line, receiving the response waveform from said semiconductor device through said transmission line after a predetermined time from the supply of the predetermined test waveform to said semiconductor device and comparing a state of the response waveform with a predetermined voltage level by an analog comparator, said multiple reflection restricting circuit comprising:

a first transistor connected between said transmission line and an input terminal of said analog comparator, said first transistor being adapted to be turned ON according to a change of the response waveform from High level to Low level to restrict a multiple reflection of the response waveform by an output side internal impedance thereof or a combination of the output side internal impedance and an impedance connected in series with the output side internal impedance;

a second transistor connected between said transmission line and said input terminal of said analog comparator, said second transistor being adapted to be turned ON according to a change of the response waveform from Low level to High level to restrict a multiple reflection of the response waveform by an output side internal impedance thereof or a combination of the output side internal impedance and an impedance connected in series with the output side internal impedance;

a first voltage generator circuit connected to said first transistor for generating a voltage for clamping the level of the response waveform at a certain Low level; and a second voltage generator circuit connected to said second transistor for generating a voltage for clamping the level of the response waveform at a certain High level.

13. A multiple reflection restricting circuit as claimed in claim 12, further comprising resistors connected between said transmission line and said first and second transistors, respectively, wherein said comparator judges the level of the response waveform, said first transistor has a control electrode connected to said first voltage generator circuit, said second transistor has a control electrode connected to said second voltage generator circuit and a sum of a resistance of said resistor connected between said transmission line and each of said first and second transistors and an ON resistance of each of said first and second transistors is set substantially equal to the characteristic impedance of said transmission line.

14. A multiple reflection restricting circuit as claimed in claim 13, wherein each of said first and second voltage generator circuits is a variable power source generating a voltage capable of being set externally, said first transistor is an NPN transistor, said second transistor is a PNP transistor, said control electrodes are bases of said first and second transistors and said impedance connected in series with the internal impedance includes said resistors provided correspondingly to said first and second transistors, respectively.

15. A semiconductor device test method for testing a semiconductor device by supplying a predetermined test waveform from a driver circuit provided in a pin electronics circuit to said semiconductor device under test through a transmission line, receiving a response waveform from said semiconductor device under test through said transmission line after a predetermined time from the supply of the predetermined test waveform to said semiconductor device and judging a state of the response waveform by an analog comparator, said semiconductor device test method comprising the steps of:

turning a first switch circuit connected between said transmission line and an input terminal of said analog comparator ON according to a change of the response waveform from High level to Low level to connect an impedance substantially equal to the characteristic impedance of said transmission line to said transmission line;

turning a second switch circuit connected between said transmission line and said input terminal of said analog comparator ON according to a change of the response waveform from Low level to High level to connect an impedance substantially equal to the characteristic impedance of said transmission line to said transmission line;

clamping the response waveform at a certain Low level when the response waveform becomes the certain Low level or lower; and clamping the response waveform at a certain High level when the response waveform becomes the certain High level or higher.

16. A semiconductor device test method as claimed in claim 15, wherein each of said first and second switch circuits is constructed with a transistor and the impedance substantially equal to the characteristic impedance of said transmission line includes an internal impedance of said transistor constituting either one of said first and second switch circuits.

* * * * *